United States Patent
Chen et al.

(10) Patent No.: US 7,715,726 B2
(45) Date of Patent: May 11, 2010

(54) HIGH IMMUNITY CLOCK REGENERATION OVER OPTICALLY ISOLATED CHANNEL

(75) Inventors: Lei Chen, Singapore (SG); Fun Kok Chow, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 437 days.

(21) Appl. No.: 11/751,389

(22) Filed: May 21, 2007

(65) Prior Publication Data

US 2008/0292325 A1  Nov. 27, 2008

(51) Int. Cl.
*H04B 10/00* (2006.01)

(52) U.S. Cl. ...................................... 398/154; 250/551

(58) Field of Classification Search ......... 398/154–155, 398/163; 250/551
See application file for complete search history.

(56) References Cited

U.S. PATENT DOCUMENTS

2004/0041947 A1 * 3/2004 Williams .................... 348/536

* cited by examiner

*Primary Examiner*—Leslie Pascal

(57) ABSTRACT

An optically isolated circuit device includes a first opto-isolator circuit that is driven by a first clock signal, and the output of the first opto-isolator circuit is used to drive a phase-locked loop (PLL) that is configured to synthesize a second clock signal having a frequency that is a multiple of the first clock signal frequency. The second clock signal is used as an input to a suitable clocked circuit of a type that benefits from optical isolation, such as an analog-to-digital converter (ADC).

14 Claims, 3 Drawing Sheets

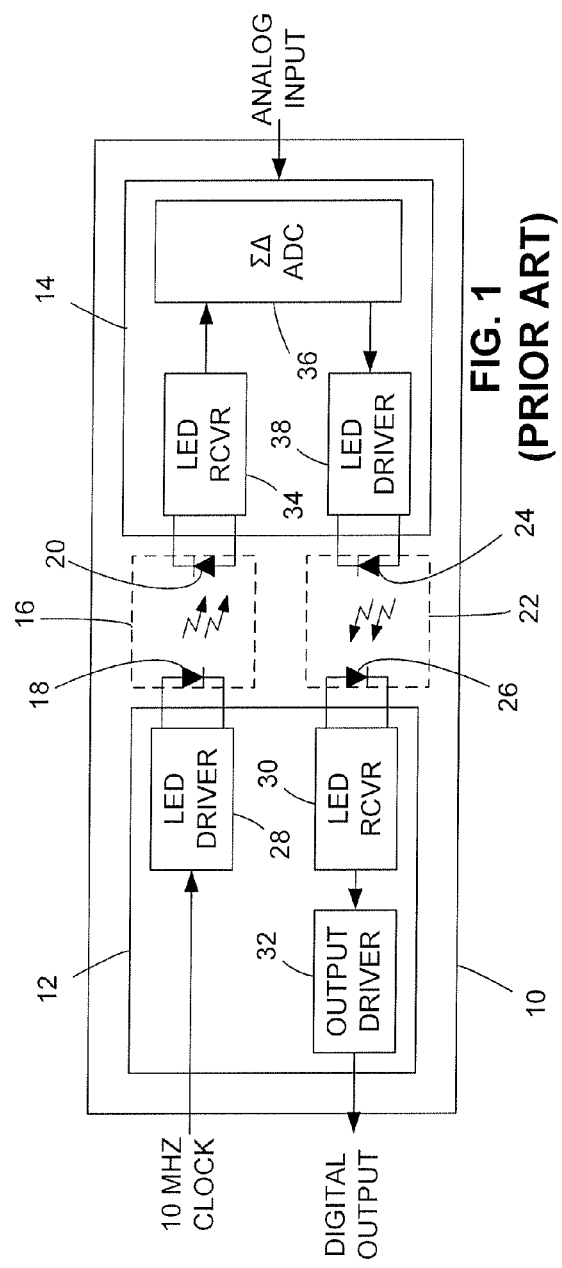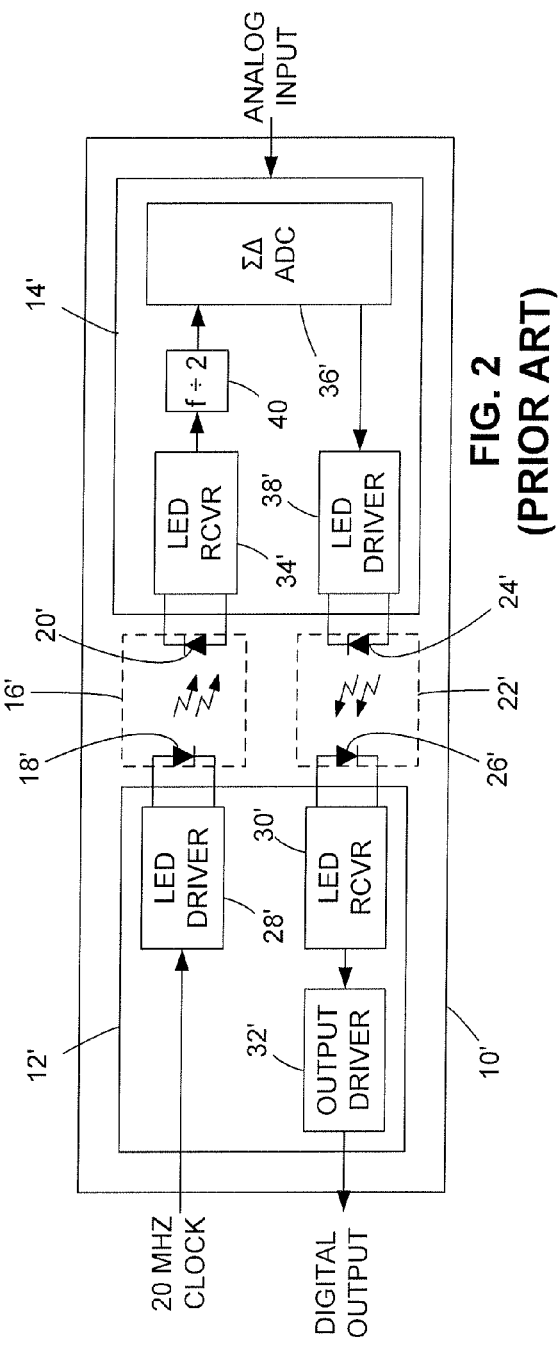

HIGH IMMUNITY CLOCK REGENERATION OVER OPTICALLY ISOLATED CHANNEL

TECHNICAL FIELD OF THE INVENTION

The invention relates generally to optical isolation circuits in voltage or current-sensing circuitry and, more specifically, to economical analog-to-digital converter chips employing such circuitry.

BACKGROUND OF THE INVENTION

Optical isolators, also known as opto-isolators, optical couplers and opto-couplers, are circuits or devices that are often included in analog-to-digital conversion circuits and similar circuits for sensitive instrumentation and control applications. For example, such a conversion circuit is commonly used to sense motor current or voltage in motor control applications. Isolating the conversion circuit from the processing circuit to which the conversion circuit provides its output signal is intended to avoid the processing circuit inducing noise or voltage spikes in the sensitive conversion circuit. In many cases, the conversion circuit and processing circuit are coupled to different ground potentials, necessitating some form of isolation.

As illustrated in FIG. 1, a prior art analog-to-digital conversion device 10 can be used to sense an analog input such as current or voltage from, for example, a motor (not shown) to be controlled, and provide a digital output representing the sensed value to the motor control circuitry (not shown). A clock signal is provided as another input to device 10, as most analog-to-digital converters, especially those of the popular sigma-delta type, require a clock signal to operate properly. Two integrated circuit chips 12 and 14 are packaged together in an integrated manner to form device 10. Chip 12 includes the interface circuitry that can be used to connect device 10 to external processing circuitry, such as a motor control circuit (not shown), and chip 14 includes the conversion circuitry that can be used to connect device 10 to the motor voltage or current sensing circuit (not shown) or other means for sensing an analog input signal. A first opto-isolator 16, comprising a first light-emitting diode (LED) 18 and a first photodetector 20, couples the clock signal from chip 12 to chip 14. A second opto-isolator 22, comprising a second LED 24 and a second photodetector 26, couples the converted signal from chip 14 to chip 12. Note that in some instances photodetector 20 is included on chip 14, and photodetector 26 is included on chip 12.

Chip 12 includes an LED driver circuit 28 that drives LED 18, an LED receiver circuit 30 that receives the output of photodetector 26, and an output driver circuit 32 that transforms the converted signal into a suitable digital output signal for driving the external processing circuitry. Chip 14 includes an LED receiver circuit 34 that receives the output of photodetector 20, the analog-to-digital converter (ADC) 36 that receives the analog input signal and performs the conversion, and an LED driver circuit 38 that drives LED 24 with the digital output of ADC 36.

ADC 36 is of the sigma-delta type because such a converter can be made to operate at high conversion speed, high precision and low power. Also, with its natural low-pass filter characteristic, this type of ADC is most suitable for noisy industrial environments. Input clock signal speeds on the order of 10 MHz are typical (as illustrated in FIG. 1). However, such a circuit is not without drawbacks. To operate at high conversion speed and precision, opto-isolators 16 and 22 need to be correspondingly high-speed devices, and high-speed opto-isolators are less economical than low-speed opto-isolators that provide equivalent performance. Also, the higher the clock speed, the greater the adverse impact of electrical and optical imperfections in the optical channel; a chip design that seeks to avoid clock jitter and high-frequency transients across a high-speed optical channel taxes various resources, driving up design and manufacturing cost. It would be desirable to maximize manufacturing economy without sacrificing conversion performance. Also, LED driver circuits 28 and 38 consume correspondingly high current at such high clock speeds. It would likewise be desirable to minimize current consumption without sacrificing conversion performance. Another problem with device 10 is that while a duty cycle of exactly 50 percent is optimal for performance of ADC 36, the high-speed optical channel can undesirably deform the 50% duty cycle of the input clock signal.

To address some of the challenges described above, such as ensuring a 50% duty cycle, the modified device 10' illustrated in FIG. 2 has been developed. Device 10' is identical to device 10 with the exception of the inclusion of a divide-by-two circuit 40. The input clock signal has a frequency twice that at which ADC 36' operates. Thus, for example, if it is desired to operate ADC 36' at a frequency of 10 MHz as in the example discussed above with regard to FIG. 1, a 20 MHz clock signal is input to device 10'. Divide-by-two circuit 40 divides the clock signal down to 10 MHz before providing it to ADC 36' and, in doing so, restores a 50% duty cycle to the signal. A drawback of device 10', however, is that the optical channel defined by opto-isolator 16' operates at 20 MHz (or 40 megabaud (Mbaud), i.e., 40 million symbol transitions per second), which is even higher than the rate of 10 MHz (or 20 Mbaud) that was already high enough to tax manufacturing and chip resources and accordingly adversely impact manufacturing economy. Device 10' consumed even more power, used more silicon area, and required an even faster opto-isolator 16' than device 10.

It would be desirable to provide an economical, high-performance, low-power, optically isolated device of the type described above. The present invention addresses these problems and deficiencies in the manner described below.

SUMMARY OF THE INVENTION

The present invention relates to an optically isolated circuit device and method for regenerating a clock signal that is transmitted across an optically isolated channel. In an exemplary embodiment, a first opto-isolator circuit is driven with a first clock signal having a first clock frequency, and the output of the first opto-isolator circuit is received and used to drive a phase-locked loop (PLL). The PLL is configured to synthesize a second clock signal having a second clock frequency that is a multiple of the first clock frequency. The second clock signal is used as an input to a suitable clocked circuit of a type that benefits from optical isolation, such as an analog-to-digital converter (ADC). An ADC circuit device in accordance with the invention addresses several of the deficiencies of prior ADC circuit devices because a PLL can produce a signal having a very precise 50 percent duty cycle, and the first opto-isolator can be an economical, relatively low-speed device (in comparison to the much higher operational frequency of the ADC itself). Transmitting the relatively low-frequency clock signal across an optical channel and regenerating the higher frequency clock signal using the PLL makes the channel highly immune to transients, optical imperfections, and other non-ideal conditions.

The device can further include a divider circuit that receives an input clock and divides its frequency down to produce the first clock signal that is transmitted across the first opto-isolator. Thus, on the output side of the first opto-isolator, the PLL can be configured as, in effect, a frequency multiplier to regenerate a clock having the same frequency as the input clock signal. An input clock signal can be used that is conveniently the same as the clock signal used by external processing circuitry, such as a motor control circuit, to latch the data produced by the ADC or other clocked circuit.

For full optical isolation, the device can further include a second driver circuit that receives the digital converted signal from the ADC and drives an input of a second opto-isolator circuit. A second receiver circuit receives the output of the second opto-isolator circuit and produces the overall digital output signal that can then be latched or otherwise processed by a motor controller or other external processing circuitry.

These and other features and advantages of the invention will become apparent from the following description, drawings and claims.

BRIEF DESCRIPTION OF THE DRAWINGS

FIG. 1 is a block diagram of an optically isolated analog-to-digital conversion device in accordance with the prior art.

FIG. 2 is a block diagram of another prior art device similar to that shown in FIG. 1.

DETAILED DESCRIPTION OF AN ILLUSTRATIVE EMBODIMENT

Figure 3:
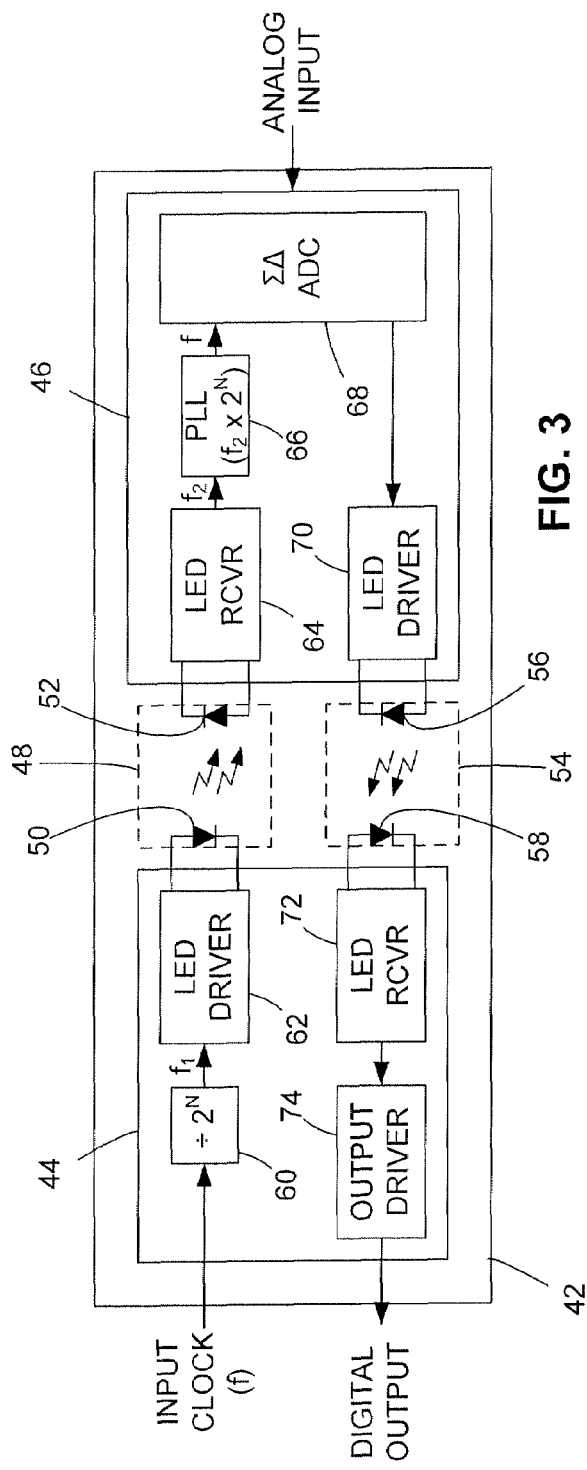
FIG. 3 is a block diagram of an optically isolated analog-to-digital conversion device in accordance with the present invention.

As shown in FIG. 3, in an illustrative embodiment of the invention, an optically isolated analog-to-digital conversion device 42 comprises two co-packaged integrated circuit chips 44 and 46. Chip 44 includes the interface circuitry that can be used to connect device 42 to external processing circuitry, such as a motor control circuit (not shown), and chip 46 includes the conversion circuitry that can be used to connect device 42 to the motor voltage or current sensing circuit (not shown) or other means for sensing an analog input signal. As described in further detail below, a first opto-isolator 48, comprising a first light-emitting diode (LED) 50 and a first photodetector 52, couples the clock signal from chip 44 to chip 46. As also described in further detail below, a second opto-isolator 54, comprising a second LED 56 and a second photodetector 58, couples the converted signal from chip 46 to chip 44. Note that each of opto-isolators 48 and 54 defines an optically isolated signal channel for its respective signal.

Chip 44 includes a divider circuit 60 that receives an input clock and divides its frequency down to produce a first clock signal. Divider circuit 60 can divide the frequency by any suitable factor, but division by a power of two (e.g., 2, 4, 8, 16, etc.) is generally most efficient to implement. An LED driver circuit 62 receives the first clock signal and drives LED 50 of opto-isolator 48. An LED receiver circuit 64 receives the output of photodetector 52 of opto-isolator 48. A phase-locked loop (PLL) 66 receives the output of LED receiver circuit 64. PLL 66, described in further detail below, is configured to synthesize a second clock signal having a second clock frequency that is a multiple of the first clock frequency. The multiple is preferably the same as the factor by which divider circuit 60 divides the input clock so that the second clock signal is, in effect, the first clock signal regenerated. For example, the factor by which divider 60 divides the input clock signal can be eight ($2^3$), and PLL 66 can multiply the signal it receives by eight to form the regenerated or second clock signal. The second clock signal is then input to an analog-to-digital converter (ADC) 68, which is preferably a sigma-delta ADC. As such sigma-delta ADCs are well-known in the art, ADC 68 is not described in further detail herein.

ADC 68 operates in the conventional manner, converting an analog input signal, such as a signal received from a motor voltage or current sensing circuit, to a digital output signal. Sigma-delta ADCs are sensitive to clock jitter and operate best when the clock signal has a duty cycle of exactly 50 percent. As described in further detail below, the clock signal synthesized by PLL 66 has a very precise 50 percent duty cycle, even if the signal that is input to PLL 66 does not have a 50 percent duty cycle. Also, the inherent low-pass characteristic of PLL 66 both filters out any clock jitter that may occur due to electrical or optical imperfections in the optically isolated clock channel defined by opto-isolator 48 and rejects any high-frequency voltage spikes that may be transmitted across the channel. Another advantage of the circuit is that, as the frequency that is passed through the channel can be made relatively low (relative to typical ADC clock frequencies in motor control and similar applications), the channel components (e.g., LED driver circuit 62, LED 50, photodetector 52 and LED receiver circuit 64) can be economical low-speed parts rather than costly high-speed parts.

An LED driver circuit 70 receives the converted signal or data signal that ADC 68 outputs. LED driver circuit 70 drives LED 56 of opto-isolator 54. An LED receiver circuit 72 in chip 44 receives the output of photodetector 58 of opto-isolator 54. An output driver circuit 74 receives the output of LED receiver circuit 72 and transforms the signal into one that is suitable for driving external processing circuitry (not shown) such as a motor controller.

Figure 4:
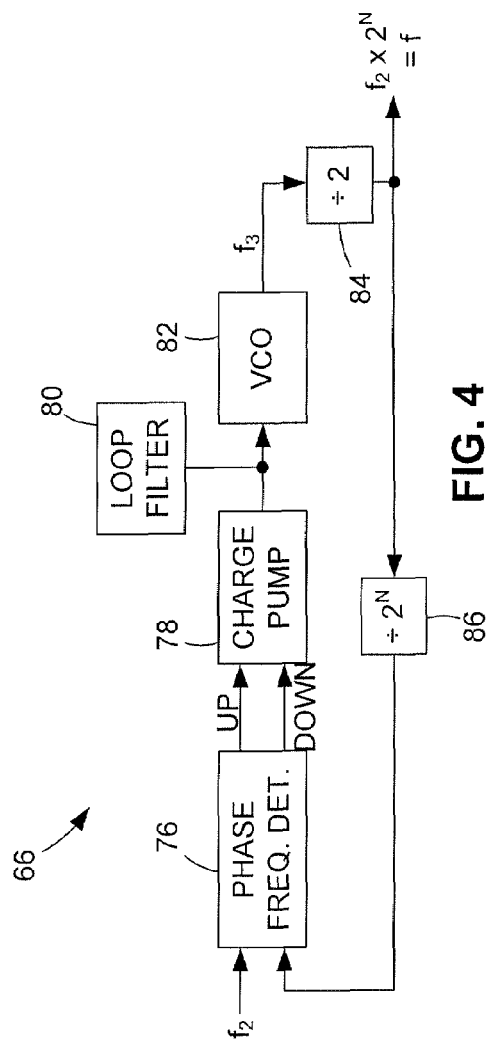
FIG. 4 is a block diagram of the phase-locked loop of the device shown in FIG. 3.

Although PLL 66 can have any suitable structure, an exemplary circuit is shown in FIG. 4. The exemplary PLL 66 is of the well-known inverter ring oscillator type and preferably has a loop bandwidth that is sufficient for the selected operation frequency. For example, for an ADC operating at a clock frequency of 10 MHz, the loop bandwidth of PLL 66 can be on the order of 100 KHz. The exemplary PLL 66 comprises a phase frequency detector 76, a charge pump 78, a loop filter 80, a voltage-controlled oscillator 82, and a divide-by-two circuit 84. Divide-by-two circuit 84 causes the output of PLL 66 to have a 50 percent duty cycle. Although this circuit divides the frequency by two for purposes of illustration, it can alternatively divide by any other power of two, such as 4, 8, 16, etc. As this arrangement is conventional for inverter ring oscillator PLLs, the structure and operation of PLL 66 are not described in further detail herein. The feedback loop of PLL 66 includes another divider circuit 86 that preferably divides the frequency by the same factor as that of divider circuit 60, thereby causing PLL 66 to output a clock signal having the same frequency (f) as the input clock that is input to divider circuit 60.

Figure 5:
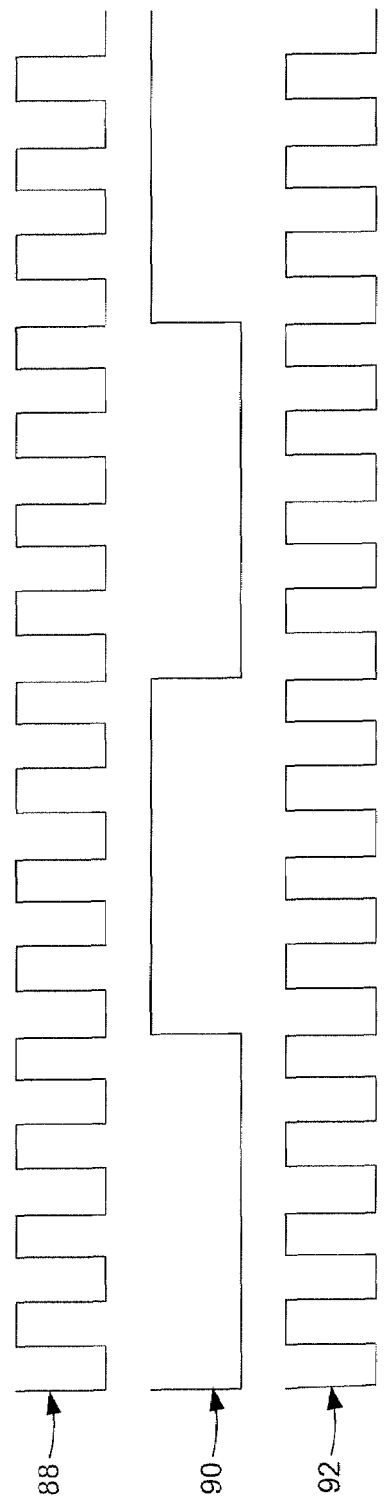
FIG. 5 is a timing diagram relating to a method of operation of the device shown in FIG. 3.

As illustrated in FIG. 5, in operation, an input clock signal 88 having a frequency (f) is provided to device 42. Although input clock signal 88 can have any suitable frequency, it may be convenient or desirable in some instances for the input clock signal to be the same as that which external processing circuitry (not shown), such as a motor control circuit, uses to latch the output data signal it receives from device 42 or perform other operations. For example, in an instance in which a motor controller operates using a 10 MHz clock signal, the input clock signal that is provided to device 42 can be the same as that 10 MHz clock signal. Note that although the use of device 42 for controlling a motor is described herein for purposes of illustration, motor control is only one example of the many uses for device 42 that will occur readily to persons skilled in the art to which the invention relates in view of the teachings herein. Indeed, device 42 can be used for any purpose for which it is known to use an ADC.

Divider circuit 60 divides the 10 MHz input clock signal down by a factor of, for example, eight, such that it outputs a 1.25 MHz first clock signal 90. The optical isolation channel defined by LED driver circuit 50, opto-isolator 48 and LED receiver circuit 52 transmits first clock signal 90. As the frequency of first clock signal 90 is a relatively low 1.25 MHz, the channel components can be economical low-speed parts rather than costly high-speed parts. In response to first clock signal 90, PLL 66 synthesizes a second clock signal 92 having a frequency that is, for example, eight times the frequency of first clock signal 90. Note that second clock signal 92 is thus, in effect, a regenerated input clock signal 88 and has the same frequency as input clock signal 88. As noted above, the action of PLL 66 ensures that second clock signal 92 has a very precise 50 percent duty cycle, even if the duty cycle of input clock signal 88 is not precisely 50 percent or if the optical isolation channel deforms the duty cycle. In addition, the low-pass filter characteristic of PLL 66 is highly immune to voltage spikes and other non-optimal conditions.

Figure 6:
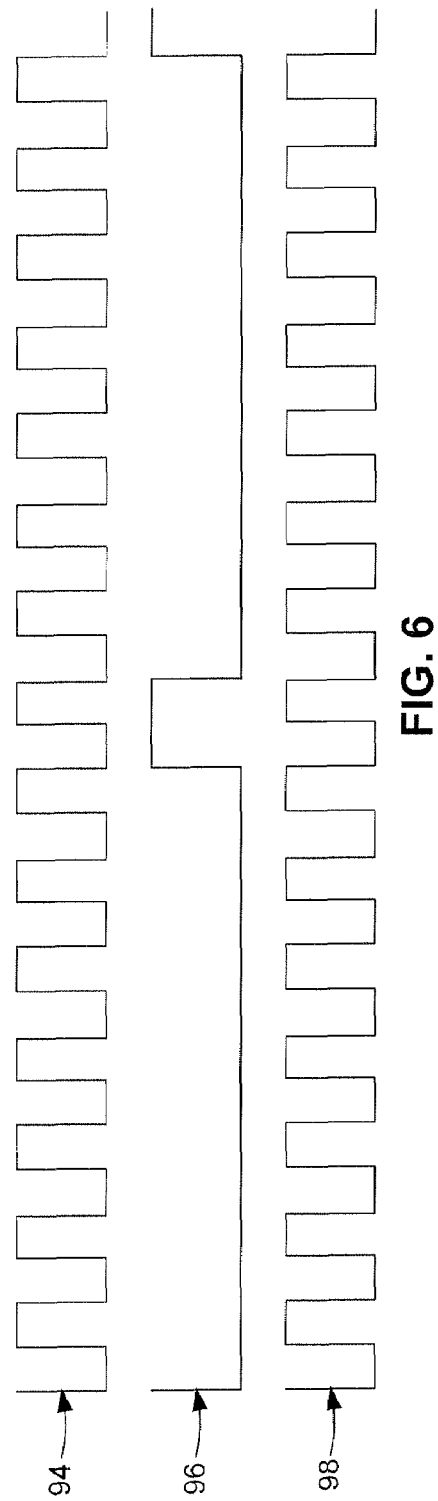
FIG. 6 is a timing diagram relating to an alternative method of operation of the device shown in FIG. 3.

Another example, illustrated in FIG. 6, illustrates an effect of duty cycle selection. In this example, although the input clock signal 94 that is provided to device 42 has a 50 percent duty cycle, divider circuit 60 (FIG. 3) is configured to produce a first clock signal 96 having a duty cycle of less than 50 percent. For example, the duty cycle of first clock signal 96 can be 12.5 percent, with the portion during which opto-isolator 48 (FIG. 3) is "on" or active (i.e., LED 18 is on or illuminated) being shorter than the portion during which opto-isolator 48 is "off" or inactive (i.e., LED 18 is off or not illuminated). Note that PLL 66 is able to convert this non-50 percent duty cycle first clock signal 96 into a second clock signal 98 having a very precise 50 percent duty cycle because PLL 66 only responds to either the rising edge or the falling edge of first clock signal 96. The shorter duty cycle (i.e., less than 50 percent) of first clock signal 94 may be advantageous because it causes LED 18 to consume less average power, as it is only illuminated for 12.5 percent of the duty cycle rather than half the duty cycle as in the example of FIG. 5. In other embodiments, the first clock signal can have any other suitable duty cycle.

It should be noted that the invention has been described with reference to one or more illustrative embodiments for the purposes of demonstrating the principles and concepts of the invention and to provide one or more examples of the manner in which the invention may be implemented. The invention is not limited to these embodiments, as will be understood by persons skilled in the art in view of the description provided herein. Those skilled in the art will understand that various modifications may be made to the embodiments described herein and that it is intended that the present invention cover all such modifications and variations provided that they come within the scope of any claims and their equivalents. With regard to the claims, no claim is intended to invoke the sixth paragraph of 35 U.S.C. Section 112 unless it includes the term "means for" followed by a participle.

What is claimed is:

1. An optically isolated circuit device, comprising:
   a divider circuit for receiving an input clock signal having an input clock frequency and dividing the input clock signal down to produce a first clock signal having a first clock frequency;
   a first opto-isolator circuit;
   a first driver circuit for receiving the first clock signal and driving an input of the first opto-isolator circuit at the first clock frequency;
   a first receiver circuit for receiving an output of the first opto-isolator circuit at the first clock frequency;
   a phase-locked loop circuit for receiving an output of the first receiver circuit and synthesizing a second clock signal having a second clock frequency that is a multiple of the first clock frequency, wherein the second clock frequency is equal to the input clock frequency;
   a clocked circuit for producing an output in response to the second clock signal;
   a second opto-isolator circuit;
   a second driver circuit for receiving the output of the clocked circuit and driving an input of the second opto-isolator circuit at the second clock frequency; and
   a second receiver circuit for receiving an output of the second opto-isolator circuit and producing a digital output signal.

2. The optically isolated circuit device claimed in claim 1, wherein the clocked circuit is an analog-to-digital converter (ADC) for receiving an analog input signal and the second clock signal and for producing a digital converted signal.

3. The optically isolated circuit device claimed in claim 2, wherein the ADC is a sigma-delta ADC.

4. The optically isolated circuit device claimed in claim 1, wherein:
   the first driver circuit and second receiver circuit are integrated together on a first integrated circuit chip; and
   the first receiver circuit and second driver circuit are integrated together on a second integrated circuit chip, wherein the first and second integrated circuit chips are packaged together to form the optically isolated circuit device.

5. The optically isolated circuit device claimed in claim 1, wherein the divider circuit divides the input clock signal down by a factor of a power of two.

6. The optically isolated circuit device claimed in claim 5, wherein the divider circuit produces a first clock signal having a duty cycle of 50 percent.

7. The optically isolated circuit device claimed in claim 5, wherein the divider circuit produces a first clock signal having a duty cycle of less than 50 percent, wherein a portion of the duty cycle during which the first opto-isolator circuit is active is shorter than a portion of the duty cycle during which the first opto-isolator circuit is inactive.

8. The optically isolated circuit device claimed in claim 7, wherein the divider circuit divides the input clock signal down by a factor of eight and produces a first clock signal having a duty cycle of 12.5 percent.

9. A method for regenerating a clock signal over an optically isolated channel, comprising:
   dividing an input clock signal having an input clock frequency down to produce a first clock signal having a first clock frequency;
   driving a first opto-isolator circuit with the first clock signal;
   receiving an output of the first opto-isolator circuit at the first clock frequency;

providing an output first opto-isolator circuit to a phase-locked loop for synthesizing a second clock signal having a second clock frequency equal to the input clock frequency; and providing the second clock signal to a clocked circuit;

driving a second opto-isolator circuit with an output signal provided by the clocked circuit; and receiving an output of the second opto-isolator circuit at the second clock frequency.

10. The method claimed in claim 9, wherein the step of providing the second clock signal to a clocked circuit comprises providing the second clock signal to an analog-to-digital converter (ADC).

11. The method claimed in claim 9, wherein the step of dividing an input clock signal down to produce the first clock signal comprises dividing the input clock signal down by a factor of a power of two.

12. The method claimed in claim 11, wherein the step of dividing an input clock signal down to produce the first clock signal comprises producing a first clock signal having a duty cycle of 50 percent.

13. The method claimed in claim 11, wherein the step of dividing an input clock signal down to produce the first clock signal comprises producing a first clock signal having a duty cycle of less than 50 percent, wherein a portion of the duty cycle during which the first opto-isolator circuit is active is shorter than a portion of the duty cycle during which the first opto-isolator circuit is inactive.

14. The method claimed in claim 11, wherein the step of dividing an input clock signal down to produce the first clock signal comprises dividing the input clock signal down by a factor of eight and producing a first clock signal having a duty cycle of 12.5 percent.

* * * * *